(12) United States Patent
Wang et al.

(10) Patent No.: US 10,658,327 B1
(45) Date of Patent: May 19, 2020

(54) CHIP BONDING APPARATUS AND BONDING METHOD

(71) Applicant: SHANGHAI MICRO ELECTRONICS EQUIPMENT (GROUP) CO., LTD., Shanghai (CN)

(72) Inventors: Tianming Wang, Shanghai (CN); Xiaoyu Jiang, Shanghai (CN); Hai Xia, Shanghai (CN); Feibiao Chen, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/338,260

(22) PCT Filed: Sep. 26, 2017

(86) PCT No.: PCT/CN2017/103331
§ 371 (c)(1),
(2) Date: Mar. 29, 2019

(87) PCT Pub. No.: WO2018/059374
PCT Pub. Date: Apr. 5, 2018

(30) Foreign Application Priority Data

Sep. 30, 2016 (CN) .......................... 2016 1 0877730

(51) Int. Cl.
*H01L 23/00* (2006.01)

(52) U.S. Cl.
CPC ...... *H01L 24/75* (2013.01); *H01L 2224/7565* (2013.01); *H01L 2224/75745* (2013.01);
(Continued)

(58) Field of Classification Search
None
See application file for complete search history.

(56) References Cited

U.S. PATENT DOCUMENTS 6,961,457 B2 * 11/2005 Sugawara ............ G06T 7/0002
382/144
9,570,417 B2 * 2/2017 Jeong ..................... H01L 24/83
(Continued)

FOREIGN PATENT DOCUMENTS

CN          1613146 A       5/2005
CN        101055846 A      10/2007
(Continued)

*Primary Examiner* — Michelle Mandala
(74) *Attorney, Agent, or Firm* — Muncy, Geissler, Olds & Lowe, P.C.

(57) ABSTRACT

Provided are a chip bonding apparatus and bonding method. The apparatus comprises: a chip supply unit (10); a substrate supply unit (20); a first pick-up assembly (30) arranged between the chip supply unit (10) and the substrate supply unit (20), comprising a first rotating component and a first pick-up head arranged on the first rotating component; a second pick-up assembly (40) comprising a second rotating component and a second pick-up head arranged on the second rotating component, wherein the first pick-up assembly (30) picks up a chip (60) from the chip supply unit (10) or the second pick-up assembly (40), and delivers the chip (60) onto a substrate of the substrate supply unit (20) to complete the bonding; and a vision unit (50) for realizing the alignment of the chip (60) and the substrate on the first pick-up assembly (30), wherein the chip supply unit (10), the substrate supply unit (20), the second pick-up assembly (40) and the vision unit (50) are respectively located on four work positions of the first pick-up head. The chip (60) is transported through rotation, improving the productivity of chip (60) bonding; and the chip (60) is reversed by utilizing the second pick-up assembly (40), which is compatible with two ways of bonding, i.e. a mark face of the chip (60) facing upwards and downwards.

11 Claims, 3 Drawing Sheets

(52) U.S. Cl.
CPC ........... *H01L 2224/75753* (2013.01); *H01L 2224/75822* (2013.01)

(56) References Cited

U.S. PATENT DOCUMENTS

| | | | | |
|---|---|---|---|---|
| 2002/0079350 | A1* | 6/2002 | Terada | B23K 31/12 |
| | | | | 228/103 |
| 2013/0181040 | A1* | 7/2013 | Watanabe | H01L 21/4814 |
| | | | | 228/211 |

FOREIGN PATENT DOCUMENTS

| | | | |
|---|---|---|---|
| CN | 101189705 | A | 5/2008 |
| CN | 103489811 | A | 1/2014 |
| CN | 104157594 | A | 11/2014 |
| CN | 104701199 | A | 6/2015 |
| CN | 105023867 | A | 11/2015 |
| TW | 418471 | | 1/2001 |
| TW | 201448098 | A | 12/2014 |
| WO | WO2007072714 | A1 | 6/2007 |

\* cited by examiner

CHIP BONDING APPARATUS AND BONDING METHOD

TECHNICAL FIELD

The present invention relates to the field of chip bonding and, in particular, to a chip bonding apparatus and bonding method.

BACKGROUND

Chip bonding is an interconnection approach for bonding chips to a substrate. The chips to be bonded are usually placed on a separation table with marks thereon facing upward and then are bonded onto a bonding table by a chip carrier. Existing chip bonding apparatus needs to pick up the chip from the separation table, pass it through a long-distance linear transportation to reach the bonding table, and bond it onto the bonding table, which significantly limits the bonding throughput. In addition, when bonding the chips to the substrate on the bonding table, there are different requirements on the orientation of the mark surfaces on the chip. Some of the chips are required to be bonded with the mark surfaces facing upward, while others are required to be bonded with the mark surfaces facing downward. Thus, it is necessary to choose a corresponding bonding apparatus to meet the requirement of mark surface orientation during bonding, leading to an additional reduction in throughput.

SUMMARY

It is an object of the present invention to provide a chip bonding apparatus and bonding method to overcome the existed problem of low bonding throughput of chips.

To solve the above technical problem, the present invention provides a chip bonding apparatus comprising:

a chip supply unit configured to provide a chip to be bonded;

a substrate supply unit configured to provide a substrate, the substrate supply unit being disposed opposite to the chip supply unit;

a first pickup assembly disposed between the chip supply unit and the substrate supply unit and comprising a first rotating part and a first pickup head disposed on the first rotating part;

a second pickup assembly disposed between the chip supply unit and the substrate supply unit and comprising a second rotating part and a second pickup head disposed on the second rotating part, wherein the first pickup assembly is configured to pick up the chip from the chip supply unit or from the second pickup assembly and convey the chip to the substrate on the substrate supply unit to accomplish bonding; and a vision unit configured to align the chip on the first pickup assembly with the substrate, wherein the chip supply unit, the substrate supply unit, the second pickup assembly and the vision unit are respectively located at four work stations of the first pickup head.

Preferably, the first pickup assembly comprises one first pickup head which is switchable, when driven by the first rotating part, among the four work positions where the chip supply unit, the substrate supply unit, the second pickup assembly and the vision unit are respectively located.

Preferably, the first pickup assembly comprises a plurality of first pickup heads which are uniformly disposed on the first rotating part and spaced apart from one another along the circumference of the first rotating part, and each of the plurality of first pickup heads is driven by the first rotating part to switch among the four work positions where the chip supply unit, the substrate supply unit, the second pickup assembly and the vision unit are respectively located.

Preferably, the first pickup assembly comprises four first pickup heads.

Preferably, the angle of each rotation of the first rotating part is equal to the angle between the adjacent first pickup heads.

Preferably, the second pickup head picks up the chip from the chip supply unit, is driven by the second rotating part to rotate, and transfers the chip to the first pickup head.

Preferably, the rotational angle of the second rotating part is 90 degrees.

Preferably, each of the first pickup head and the second pickup head is a vacuum suction head.

Preferably, the vacuum suction head is able to translate axially.

The present invention also provides a chip bonding method used with the chip bonding apparatus as defined above, comprising the following steps:

(S1) loading a chip onto the chip supply unit with a mark surface of the chip facing upward, and loading a substrate onto the substrate supply unit;

(S2) determining a required orientation of the mark surface of the chip when bonding;

(S3) if the mark surface is required to face downward during bonding, the first pickup assembly picks up the chip from the chip supply unit and conveys the chip to the substrate on the substrate supply unit to complete bonding; and (S4) if the mark surface is required to face upward during bonding, the second pickup assembly picks up the chip from the chip supply unit and conveys the chip to the first pickup assembly which further conveys the chip to the substrate on the substrate supply unit to complete bonding.

Preferably, steps S3 and S4 each comprise scanning the position of the chip on the first pickup assembly by the vision unit and aligning the chip with the substrate.

Compared to the prior art, the chip bonding apparatus and bonding method provided in the present invention offer the following advantages:

1. In the present invention, the opposite arrangement between the substrate supply unit and the chip supply unit in combination with the rotation of the first rotating part, enables the transmission of the chip from the chip supply unit to the substrate supply unit, and converts the conventional long-distance linear transmission to vertical flip transmission, thereby resulting in a largely improved bonding productivity of chips.

2. The first pickup assembly alone can be used to accomplish pickup and bonding of the chip when the chip is required to be bonded with its mark surface facing downward, and in the case when the chip is required to be bonded with its mark surface facing upward, the handover from the second pickup assembly to the first pickup assembly is utilized to accomplish the flip of the chip after the chip is picked up by the second pickup assembly, thereby enabling both cases that the chip is bonded with its mark surface facing upward and downward.

In the figures: 10—chip supply unit; 20—substrate supply unit; 30—first pickup assembly; 31—first rotating part; 32—first pickup head; 40—second pickup assembly; 41—second rotating part; 42—second pickup head; 50—vision unit; 60—chip; and 61—mark surface.

DETAILED DESCRIPTION

To make the objects, advantages and features of the present invention more clear, the embodiments of the present invention will be described in greater detail below with reference to accompanying figures. It should be noted that the accompanying drawings are presented in a very simplified form and not necessarily presented to scale, with the only intention to facilitate convenience and clarity in explaining the object of the present invention.

Figure 1:
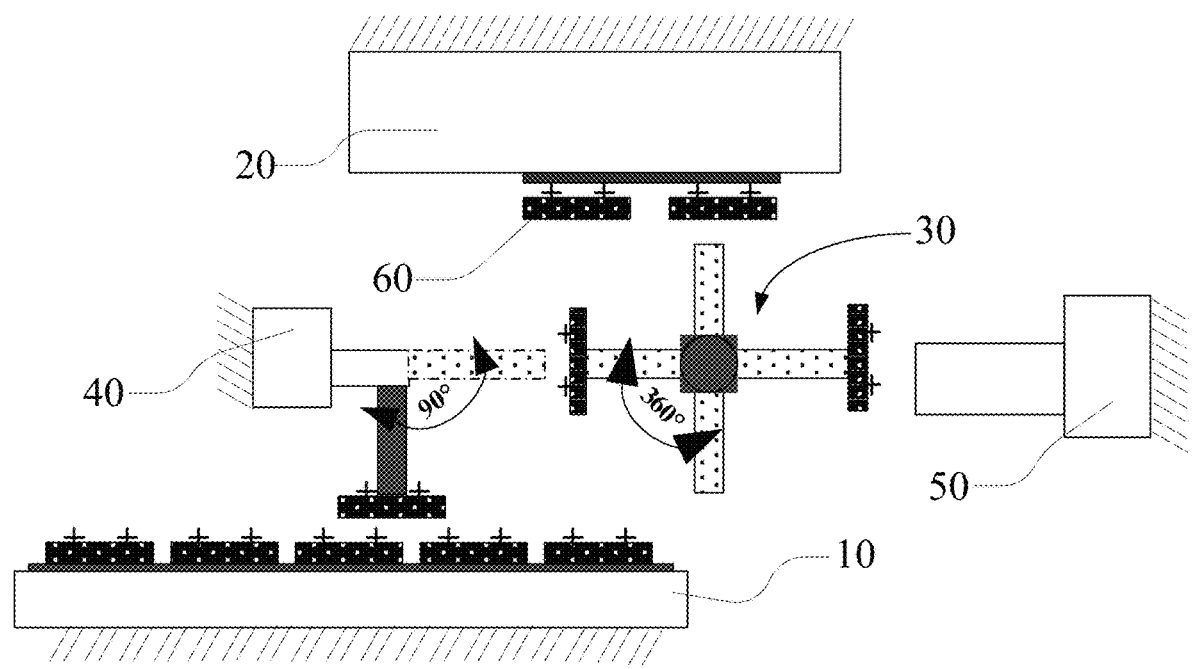
FIG. 1 is a schematic structural diagram of a chip bonding apparatus according to an embodiment of the present invention.
Figure 2:
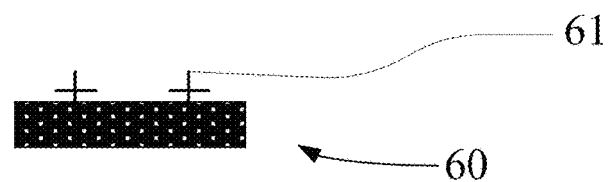
FIG. 2 is a schematic structural diagram of a chip according to an embodiment of the present invention.
Figure 3:
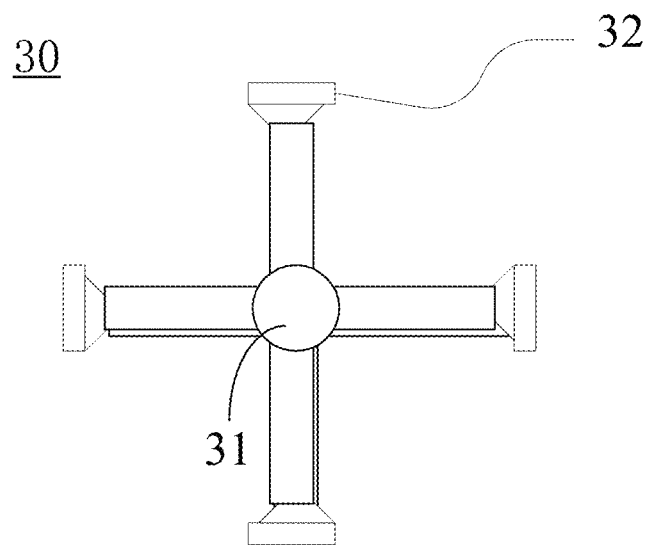
FIG. 3 is a schematic structural diagram of a first pickup assembly according to an embodiment of the present invention.

A chip bonding apparatus provided in the present invention, as shown in FIG. 1 to FIG. 3, includes:

a chip supply unit 10 configured to separate a single chip 60 from a wafer and provide the chip 60 to be bonded to a pickup assembly as described below;

a substrate supply unit 20 configured to provide a substrate and disposed opposite to the chip supply unit 10, wherein the substrate supply unit 20 is disposed over and inverted with respect to the chip supply unit 10 in this embodiment;

a first pickup assembly 30 disposed between the chip supply unit 10 and the substrate supply unit 20 and comprising a first rotating part 31 and a first pickup head 32 disposed on the first rotating part 31;

a second pickup assembly 40 also disposed between the chip supply unit 10 and the substrate supply unit 20 and comprising a second rotating part 41 and a second pickup head 42 disposed on the second rotating part 41, wherein the first pickup assembly 30 picks up the chip 60 from the chip supply unit 10 or from the second pickup assembly 40 and conveys the chip to the substrate on the substrate supply unit 20 to accomplish bonding; and a vision unit 50 configured to align the chip 60 on the first pickup assembly 30 with the substrate, wherein the chip supply unit 10, the substrate supply unit 20, the second pickup assembly 40 and the vision unit 50 are respectively located at four work positions of the first pickup head 30.

Specifically, according to the present invention, the reverted arrangement of the substrate supply unit 20 over the chip supply unit 10 in combination with the rotation of the first rotating part 31, enables the transmission of the chip 60 from the chip supply unit 10 to the substrate supply unit 20, and converts the conventional long-distance linear transmission to vertical flip transmission, thereby resulting in a largely improved bonding productivity of chips.

Preferably, the number of the first pickup head 32 may be one and the first pickup head 32 is driven by the first rotating part 31 to switch among the four work positions where the chip supply unit 10, the substrate supply unit 20, the second pickup assembly 40 and the vision unit 50 are respectively positioned. Specifically, the first pickup head 32 picks up the chip 60 at the work station corresponding to the chip supply unit 10 or the second pickup assembly 40, receives a position scan at the work station corresponding to the vision unit 50 and implements bonding at the work station corresponding to the substrate supply unit 20.

Preferably, please particularly refer to FIG. 3, there are a plurality of first pickup heads 32 (this embodiment takes four first pickup heads 32 as an example). The four first pickup heads 32 are uniformly disposed on the first rotating part 31 and spaced apart from one another in a circumferential direction. Each of the first pickup heads 32 is driven by the first rotating part 31 to switch among the four work positions where the chip supply unit 10, the substrate supply unit 20, the second pickup assembly 40 and the vision unit 50 are respectively positioned. Preferably, please refer to FIG. 1, the substrate supply unit 20, the chip supply unit 10, the second pickup assembly 40 and the vision unit 50 are respectively disposed above the first pickup assembly 30, under the first pickup assembly 30, at the left of the first pickup assembly 30 and at the right of the first pickup assembly 30. When the first rotating part 31 stops rotation, the four first pickup heads 32 respectively correspond to the chip supply unit 10, the substrate supply unit 20, the second pickup assembly 40 and the vision unit 50. In this way, each of the first pickup heads 32 can perform different actions at different work positions, thereby resulting in a further improved bonding productivity.

Preferably, an angle of each rotation of the first rotating part 31 is equal to an angle between adjacent first pickup heads 32. Continuously taking the four first pickup heads 32 as an example, the angle of each rotation of the first rotating part 31 is 90 degrees.

Figure 4:
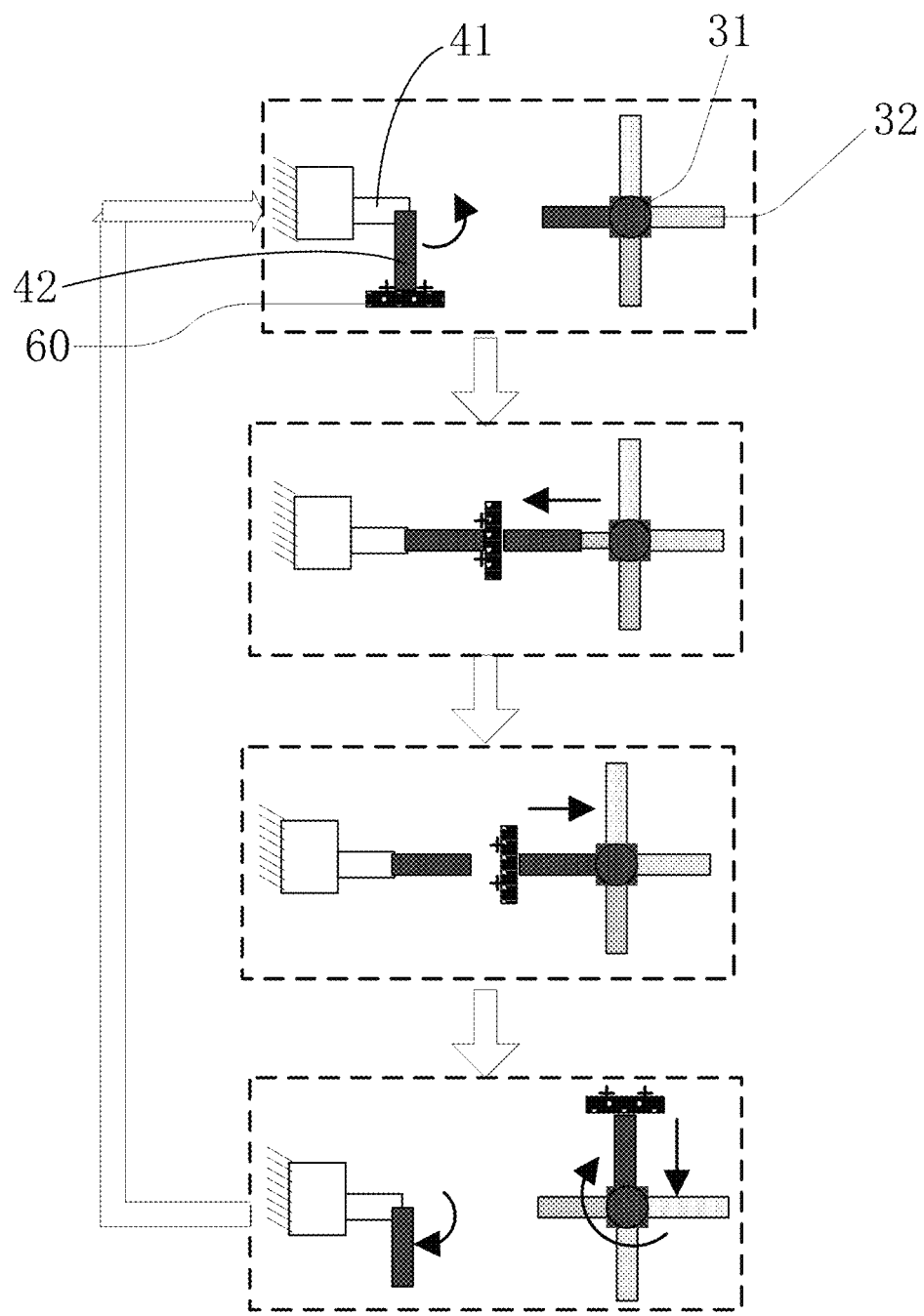
FIG. 4 is a schematic diagram of a transfer process between a first pickup assembly and a second pickup assembly when the mark surface of a chip is required to face upward according to an embodiment of the present invention.

Preferably, please particularly refer to FIG. 1 and FIG. 4, the second pickup head 42 picks up the chip 60 from the chip supply unit 10, is driven by the second rotating part 41 to rotate, and transfers the chip 60 to the first pickup head 32. Preferably, the angle of each rotation of the second rotating part 41 is 90 degrees. In the present invention, the chip 60 is transferred to one of the first pickup heads 32 through the rotation of the second rotating part 41 after the chip 60 is picked up by the second pickup head 42, and thereby achieving the flip over of the chip 60 by the handover between the first pickup head 32 and the second pickup head 42.

Preferably, in this embodiment, each of the first pickup heads 32 and the second pickup heads 42 is a vacuum suction head capable of linear movement along an axial direction to facilitate the absorption and pickup of the chip 60.

Please particularly refer to FIG. 4, the present invention also provides a chip bonding method used with the chip bonding apparatus as defined above, comprising the following steps:

(S1) loading a wafer with a chip 60 onto the chip supply unit 10, wherein the mark surface 61 of the chip 60 faces upward, and loading a substrate onto the substrate supply unit 20;

(S2) determining a required orientation of the mark surface 61 of the chip 60 during its bonding;

(S3) if the mark surface 61 is required to face downward during bonding, the first pickup assembly 30 picks up the chip 60 from the chip supply unit 10 and conveys the chip 60 to the substrate on the substrate supply unit 20 to complete the bonding. During this process, the second pickup assembly 40 keeps stationary at the initial position;

(S4) if the mark surface 61 is required to face upward during bonding, the second pickup assembly 40 picks up the chip 60 from the chip supply unit 10 and transfers the chip 60 to the first pickup assembly 30. The entire handover is as shown in FIG. 4. The second pickup head 42 firstly picks up the chip 60 and switches to a transfer location. One of the first pickup heads 32 then stretches out to receive the chip 60 and retracts back with the chip 60. Subsequently, the second pickup head 42 rotates downward to the original position, meanwhile the first pickup head 32 rotates to the bonding station through the driving of the rotating part 31, and extends upward to bond the chip 60. Of course, after the handover of the chip 60 from the second pickup head 42 to the first pickup head 32, the first pickup assembly conveys the chip 60 onto the substrate on the substrate supply unit 20 to accomplish the bonding.

Preferably, steps S3 and S4 each include configuring a vision unit 50 to scan the position of the chip 60 on the first pickup assembly in order to achieve alignment between the chip 60 and the substrate.

In summary, the present invention provides a chip bonding apparatus and bonding method. The chip bonding apparatus includes: a chip supply unit 10 configured to provide a chip 60 to be bonded; a substrate supply unit 20 configured to provide a substrate and disposed opposite to the chip supply unit 10; a first pickup assembly 30 disposed between the chip supply unit 10 and the substrate supply unit 20 and comprising a first rotating part 31 and a first pickup head 32 disposed on the first rotating part 31; a second pickup assembly 40 disposed between the chip supply unit 10 and the substrate supply unit 20 and comprising a second rotating part 41 and a second pickup head 42 disposed on the second rotating part 41, wherein the first pickup assembly 30 picks up the chip 60 from the chip supply unit 10 or from the second pickup assembly 40 and conveys the chip 60 to the substrate on the substrate supply unit 20 to accomplish bonding; and a vision unit 50 configured to align the chip 60 on the first pickup assembly 30 with the substrate, wherein the chip supply unit 10, the substrate supply unit 20, the second pickup assembly 40 and the vision unit 50 are respectively located at four work positions of the first pickup head 42. In the present invention, the positional relationship between the substrate supply unit 20 and the chip supply unit 10, in combination with the rotation of the first rotating part 31, enables the transmission of the chip 60 and converts the long-distance linear transmission to vertical flip transmission, thereby resulting in a largely improved bonding productivity of chips. In addition, the first pickup assembly 30 alone can be used to accomplish pickup and bonding of the chip 60 when the chip 60 is required to be bonded with its mark surface 61 facing downward, and in the case when the chip is required to be bonded with the its mark surface facing upward, the handover from the second pickup assembly 40 to the first pickup assembly 30 is utilized to accomplish the flip of the chip 60 after the chip 60 is picked up by the second pickup assembly 40, thereby enabling both cases that the chip is bonded with its mark surface facing upward and downward.

It is apparent that those skilled in the art can make various modifications and variations of the present invention without departing from the spirit and scope thereof. Accordingly, the invention is intended to embrace all such modifications and variations if they fall within the scope of the appended claims and equivalents thereof.

What is claimed is:
1. A chip bonding apparatus, comprising:
  a chip supply unit configured to provide a chip to be bonded;
  a substrate supply unit configured to provide a substrate, the substrate supply unit being disposed opposite to the chip supply unit;
  a first pickup assembly disposed between the chip supply unit and the substrate supply unit and comprising a first rotating part and a first pickup head disposed on the first rotating part;
  a second pickup assembly disposed between the chip supply unit and the substrate supply unit and comprising a second rotating part and a second pickup head disposed on the second rotating part, wherein the first pickup assembly is configured to pick up the chip from the chip supply unit or from the second pickup assembly and convey the chip to the substrate on the substrate supply unit to accomplish bonding; and
  a vision unit configured to align the chip on the first pickup assembly with the substrate, wherein the chip supply unit, the substrate supply unit, the second pickup assembly and the vision unit are respectively located at four work positions of the first pickup head.

2. The chip bonding apparatus according to claim 1, wherein the first pickup assembly comprises one first pickup head which is switchable, when driven by the first rotating part, among the four work positions where the chip supply unit, the substrate supply unit, the second pickup assembly and the vision unit are respectively located.

3. The chip bonding apparatus according to claim 1, wherein the first pickup assembly comprises a plurality of first pickup heads which are uniformly disposed on the first rotating part and spaced apart from one another along a circumference of the first rotating part, and each of the plurality of first pickup heads is driven by the first rotating part to switch among the four work positions where the chip supply unit, the substrate supply unit, the second pickup assembly and the vision unit are respectively located.

4. The chip bonding apparatus according to claim 3, wherein the first pickup assembly comprises four first pickup heads.

5. The chip bonding apparatus according to claim 3, wherein an angle of each rotation of the first rotating part is equal to an angle between adjacent first pickup heads.

6. The chip bonding apparatus according to claim 1, wherein the second pickup head picks up the chip from the chip supply unit and is driven by the second rotating part to rotate and transfers the chip to the first pickup head.

7. The chip bonding apparatus according to claim 6, wherein a rotational angle of the second rotating part is 90 degrees.

8. The chip bonding apparatus according to claim 6, wherein each of the first pickup head and the second pickup head is a vacuum suction head.

9. The chip bonding apparatus according to claim 8, wherein the vacuum suction head is able to translate axially.

10. A chip bonding method used with the chip bonding apparatus according to claim 1, comprising the following steps:
  (S1) loading a chip onto a chip supply unit with a mark surface of the chip facing upward, and loading a substrate onto a substrate supply unit;
  (S2) determining a required orientation of the mark surface of the chip during bonding;
  (S3) if the mark surface is required to face downward during bonding, a first pickup assembly picks up the chip from the chip supply unit and conveys the chip to the substrate on the substrate supply unit to complete bonding; and (S4) if the mark surface is required to face upward during bonding, a second pickup assembly picks up the chip from the chip supply unit and conveys the chip to the first pickup assembly which further conveys the chip to the substrate on the substrate supply unit to complete bonding.

11. The chip bonding method according to claim 10, wherein steps S3 and S4 each comprise scanning a position of the chip on the first pickup assembly by a vision unit and aligning the chip with the substrate.

* * * * *